United States Patent
Bae et al.

(10) Patent No.: US 10,483,985 B2
(45) Date of Patent: Nov. 19, 2019

(54) OSCILLATOR USING SUPPLY REGULATION LOOP AND OPERATING METHOD THEREOF

(71) Applicants: SAMSUNG ELECTRONICS CO., LTD., Suwon-si (KR); Research & Business Foundation SUNGKYUNKWAN UNIVERSITY, Suwon-si (KR)

(72) Inventors: Chisung Bae, Yongin-si (KR); Sangjoon Kim, Hwaseong-si (KR); Yoonmyung Lee, Seongnam-si (KR); Jaehong Jung, Bucheon-si (KR); Jung-Hoon Chun, Suwon-si (KR)

(73) Assignees: Samsung Electronics Co., Ltd., Suwon-si (KR); Research & Business Foundation Sungkyunkwan University, Suwon-si (KR)

(*) Notice: Subject to any disclaimer, the term of this patent is extended or adjusted under 35 U.S.C. 154(b) by 39 days.

(21) Appl. No.: 15/834,342

(22) Filed: Dec. 7, 2017

(65) Prior Publication Data

US 2018/0212610 A1 Jul. 26, 2018

Related U.S. Application Data

(60) Provisional application No. 62/449,284, filed on Jan. 23, 2017.

(30) Foreign Application Priority Data

Jun. 29, 2017 (KR) .................. 10-2017-0082687

(51) Int. Cl.
*H03L 3/00* (2006.01)
*H03L 1/00* (2006.01)
(Continued)

(52) U.S. Cl.
CPC .................. *H03L 3/00* (2013.01); *H03L 1/00* (2013.01); *H03L 5/00* (2013.01); *H03L 7/02* (2013.01);
(Continued)

(58) Field of Classification Search
CPC ....................................................... H03L 3/00
(Continued)

(56) References Cited

U.S. PATENT DOCUMENTS 6,462,625 B2 10/2002 Kim
6,653,907 B2 11/2003 Kobota
(Continued)

FOREIGN PATENT DOCUMENTS

JP 2016-116155 A 6/2016

OTHER PUBLICATIONS

Jang, Taekwang, et al. "A 4.7 nW 13.8 ppm/° C. Self-Biased Wakeup Timer Using a Switched-Resistor Scheme." *Solid-State Circuits Conference (ISSCC), 2016 IEEE International.* IEEE, 2016: 1-10. (10 pages, in English).

*Primary Examiner* — Joseph Chang
(74) *Attorney, Agent, or Firm* — NSIP Law (57) ABSTRACT

An oscillator using a supply regulation loop and a method of operating the oscillator are provided. The oscillator includes a reference voltage generator configured to generate reference voltages from a supply voltage, a supply regulation loop circuit including a first operational amplifier and a transistor, the first operational amplifier being configured to receive a first reference voltage of the reference voltages, and the transistor being connected to an output terminal of the first operational amplifier, and a frequency locked loop (FLL) circuit configured to generate a clock signal, based on an input voltage determined based on a current flowing in the transistor and a second reference voltage of the reference (Continued)

voltages, wherein the first operational amplifier may include an input terminal configured to receive the first reference voltage and to receive negative feedback from the transistor, and the output terminal being configured to generate an output voltage independent of noise of the supply voltage.

19 Claims, 9 Drawing Sheets

(51) Int. Cl.
  *H03L 5/00* (2006.01)
  *H03L 7/099* (2006.01)
  *H03L 7/02* (2006.01)
  *H03L 7/06* (2006.01)

(52) U.S. Cl.
  CPC ............ *H03L 7/06* (2013.01); *H03L 7/099* (2013.01); *H03L 7/0995* (2013.01)

(58) Field of Classification Search
  USPC .......................................................... 331/34
  See application file for complete search history.

(56) References Cited

U.S. PATENT DOCUMENTS

| | | |
|---|---|---|
| 6,917,249 B1 | 7/2005 | Kuo et al. |
| 7,009,429 B2 | 3/2006 | Eberlein |
| 7,474,162 B2 * | 1/2009 | D'Abramo ............ H03K 3/011 327/132 |
| 8,330,514 B2 | 12/2012 | Lee |
| 8,497,741 B2 | 7/2013 | Pedersen et al. |
| 9,287,823 B1 | 3/2016 | Holzmann |
| 9,300,247 B2 | 3/2016 | Roine et al. |
| 9,385,692 B2 | 7/2016 | Blaauw et al. |
| 2007/0205824 A1 * | 9/2007 | Perisetty ............ H03K 19/0013 327/536 |
| 2011/0316515 A1 * | 12/2011 | Mitsuda ................. G05F 3/30 323/314 |
| 2015/0200625 A1 | 7/2015 | Portmann et al. |
| 2016/0164460 A1 * | 6/2016 | Jang ..................... H03B 5/1265 331/25 |

* cited by examiner

OSCILLATOR USING SUPPLY REGULATION LOOP AND OPERATING METHOD THEREOF

CROSS-REFERENCE TO RELATED APPLICATION(S)

This application claims the benefit under 35 U.S.C. § 119(e) of U.S. Provisional Application No. 62/449,284 filed on Jan. 23, 2017, in the U.S. Patent and Trademark Office, and claims the benefit under 35 U.S.C. § 119(a) of Korean Patent Application No. 10-2017-0082687 filed on Jun. 29, 2017, in the Korean Intellectual Property Office, the entire disclosures of which are incorporated herein by reference for all purposes.

BACKGROUND

1. Field

The following description relates to an oscillator using a supply regulation loop and a method of operating the oscillator.

2. Description of Related Art

An oscillator is a circuit to generate a clock signal with a frequency, and is applicable to various electronic devices. Since the clock signal has an influence on operations of other internal circuits, the clock signal needs to have a high stability. However, a frequency may be out of an allowable error range due to a circuit layout, a process variation, a temperature change and a change in a supply voltage.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided an oscillator includes a reference voltage generator configured to generate reference voltages from a supply voltage, a supply regulation loop circuit including a first operational amplifier and a transistor, the first operational amplifier being configured to receive a first reference voltage of the reference voltages, and the transistor being connected to an output terminal of the first operational amplifier, and a frequency locked loop (FLL) circuit configured to generate a clock signal, based on an input voltage determined based on a current flowing in the transistor and a second reference voltage of the reference voltages, wherein the first operational amplifier may include an input terminal configured to receive the first reference voltage and to receive negative feedback from the transistor, and the output terminal being configured to generate an output voltage independent of noise of the supply voltage.

The output voltage generated by the output terminal of the first operational amplifier may be provided to a gate terminal of the transistor, the supply voltage may be provided to a source terminal of the transistor, and a drain voltage of the transistor may be fed back to the input terminal of the first operational amplifier.

A magnitude of the current flowing in the transistor may decrease in response to an increase in the output voltage provided to the gate terminal of the transistor.

The input voltage may be determined based on a drain voltage of the transistor and a voltage drop in a switch resistor in which the current flows.

The FLL circuit may include a second operational amplifier including an input terminal configured to receive the second reference voltage and the input voltage, and an output terminal connected to a voltage-controlled oscillator (VCO), and the VCO may be configured to generate the clock signal based on a control voltage output from the output terminal of the second operational amplifier.

The FLL circuit may include a switch capacitor configured to be charged or discharged based on the clock signal and may be connected in series to a switch resistor in which the current flows.

The oscillator may include a self-biasing circuit configured to generate a bias voltage based on the output voltage and a third reference voltage of the reference voltages and to provide the bias voltage to the first operational amplifier and a second operational amplifier included in the oscillator.

The self-biasing circuit may include a start-up circuit configured to determine the bias voltage to be less than a reference voltage based on the third reference voltage that may be input in an initial state of the oscillator.

The start-up circuit may be configured to determine the bias voltage so that a bandwidth of the second operational amplifier in the initial state may be wider than a bandwidth of the second operational amplifier in a steady state of the oscillator.

An operation of the start-up circuit may be terminated by the third reference voltage that may be input in a steady state of the oscillator, and in the steady state, the bias voltage may correspond to an output voltage output from the first operational amplifier.

The first reference voltage may be determined to be greater than the second reference voltage.

A switch resistor in which the current flows and a switch capacitor connected in series to the switch resistor may be compensated for in response to a temperature change.

A bandwidth of the supply regulation loop circuit may be determined to be greater than a bandwidth of the FLL circuit.

The reference voltage generator may include a 2-to-1 switched-capacitor converter and p-channel field-effect transistors (PFETs) stack, and the first reference voltage and the second reference voltage may be generated as a portion of a third reference voltage in the PFETs stack.

In another general aspect, there is provided a method of operating an oscillator, including generating reference voltages from a supply voltage, generating an output voltage independent of noise of the supply voltage based on a first reference voltage among the reference voltages, and negative feedback from a transistor, and generating a clock signal based on an input voltage determined based on a current flowing in the transistor and a second reference voltage among the reference voltages.

The method may include generating a bias voltage based on the output voltage and a third reference voltage among the reference voltages and providing the bias voltage to a first operational amplifier and a second operational amplifier included in the oscillator.

The generating of the bias voltage may include determining the bias voltage to be less than a reference voltage based on the third reference voltage that may be input in an initial state of the oscillator.

The generating of the bias voltage may include terminating an operation of a start-up circuit by the third reference voltage that may be input in a steady state of the oscillator, and generating the bias voltage to correspond to an output voltage output from the first operational amplifier.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after gaining a thorough understanding of the disclosure of this application. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The following structural or functional descriptions of examples disclosed in the present disclosure are merely intended for the purpose of describing the examples and the examples may be implemented in various forms. The examples are not meant to be limited, but it is intended that various modifications, equivalents, and alternatives are also covered within the scope of the claims.

Although terms of "first," "second," etc. are used to explain various components, the components are not limited to such terms. These terms are used only to distinguish one component from another component. For example, a first component may be referred to as a second component, or similarly, the second component may be referred to as the first component within the scope of the right according to the concept of the present disclosure.

As used herein, the singular forms are intended to include the plural forms as well, unless the context clearly indicates otherwise.

Figure 1:
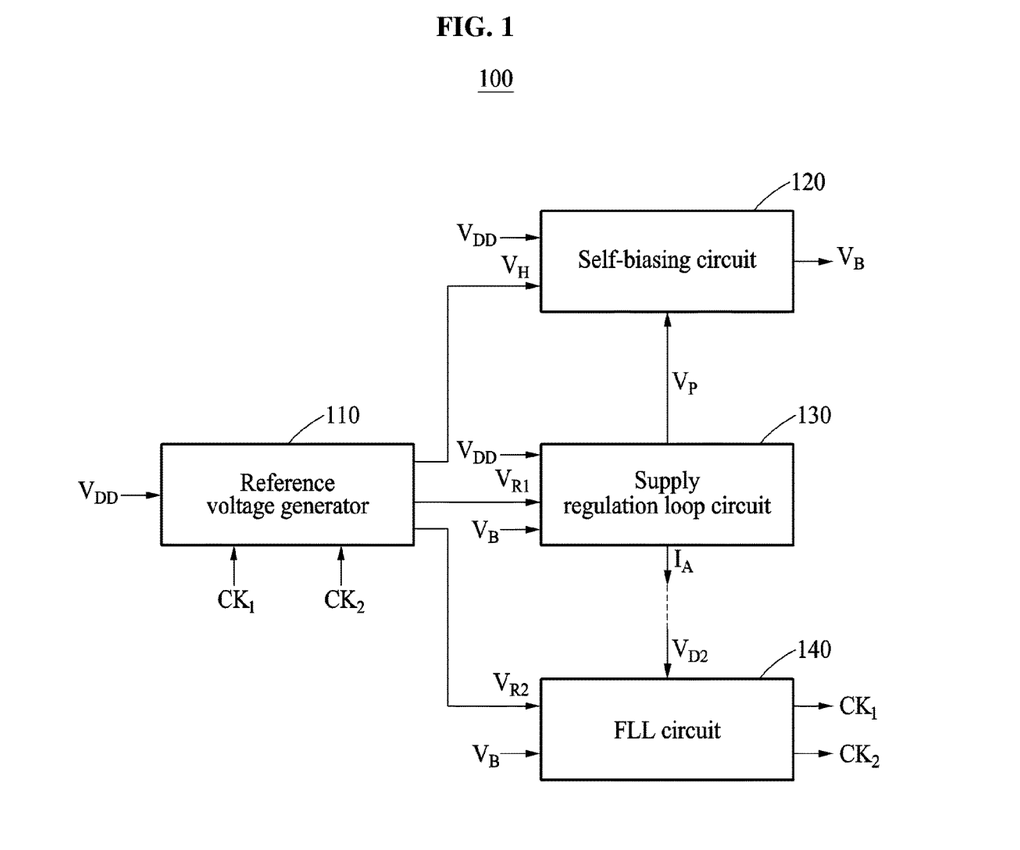
FIG. 1 is a diagram illustrating an example of an oscillator.

FIG. 1 illustrates an example of an oscillator 100. Referring to FIG. 1, the oscillator 100 includes a reference voltage generator 110, a self-biasing circuit 120, a supply regulation loop circuit 130, and a frequency locked loop (FLL) circuit 140.

The oscillator 100 generates a clock signal, and includes, for example, a resistor-capacitor (RC) oscillator. The oscillator 100 generates a clock signal at a high frequency stability. The oscillator 100 as shown in FIG. 1 provides stability characteristic.

The reference voltage generator 110 generates a plurality of reference voltages, for example, reference voltages $V_H$, $V_{R1}$ and $V_{R2}$, from a supply voltage $V_{DD}$. The reference voltages $V_H$, $V_{R1}$ and $V_{R2}$ generated by the reference voltage generator 110 are provided to the self-biasing circuit 120, the supply regulation loop circuit 130 and the FLL circuit 140, respectively.

The self-biasing circuit 120 generates a bias voltage $V_B$ based on the reference voltage $V_H$ received from the reference voltage generator 110 and a voltage $V_P$ received from the supply regulation loop circuit 130. The self-biasing circuit 120 provides the bias voltage $V_B$ to operational amplifiers included in the oscillator 100. For example, the self-biasing circuit 120 provides the bias voltage $V_B$ to an operational amplifier included in each of the supply regulation loop circuit 130 and the FLL circuit 140.

The supply regulation loop circuit 130 generates the voltage $V_P$ based on the reference voltage $V_{R1}$ received from the reference voltage generator 110, the bias voltage $V_B$ received from the self-biasing circuit 120, and a voltage $V_{D1}$ (not shown) due to negative feedback. The voltage $V_{D1}$ has a characteristic that is independent and that is not affected by noise (for example, ripples) of the supply voltage $V_{DD}$ due to a feedback loop. Because the voltage $V_{D1}$ is not affected by the noise of the supply voltage $V_{DD}$, the voltage $V_P$ and a current $I_A$ in a steady state are also not affected by the noise of the supply voltage $V_{DD}$. The characteristic that is independent and that is not affected by the noise of the supply voltage $V_{DD}$ indicates that an influence by the noise of the supply voltage $V_{DD}$ is less than or equal to a reference value. For example, the supply regulation loop circuit 130 is a low dropout (LDO) regulator.

In an example, the supply regulation loop circuit 130 generates a stable current $I_A$ through a feedback control. Similarly to the voltage $V_{D1}$, the current $I_A$ also has a characteristic that is independent of the noise of the supply voltage $V_{DD}$.

The FLL circuit 140 generates clock signals $CK_1$ and $CK_2$ based on a voltage $V_{D2}$ determined based on the current $I_A$, the reference voltage $V_{R2}$ received from the reference voltage generator 110, and the bias voltage $V_B$ received from the self-biasing circuit 120. The clock signals $CK_1$ and $CK_2$ generated by the FLL circuit 140 have characteristics robust against the noise of the supply voltage $V_{DD}$, and an offset voltage $V_{OS}$ (not shown) of an operational amplifier included in the oscillator 100. The clock signals $CK_1$ and $CK_2$ generated by the FLL circuit 140 are input to the reference voltage generator 110 and used.

In the following description, for convenience of description, the reference voltages $V_{R1}$, $V_{R2}$ and $V_H$ generated by the reference voltage generator 110 are referred to as a "first reference voltage," a "second reference voltage" and a "third reference voltage," respectively. Also, the voltages $V_{D1}$, $V_{D2}$ and $V_P$ are referred to as a "first input voltage," a "second input voltage" and an "output voltage," respectively.

Figure 2:
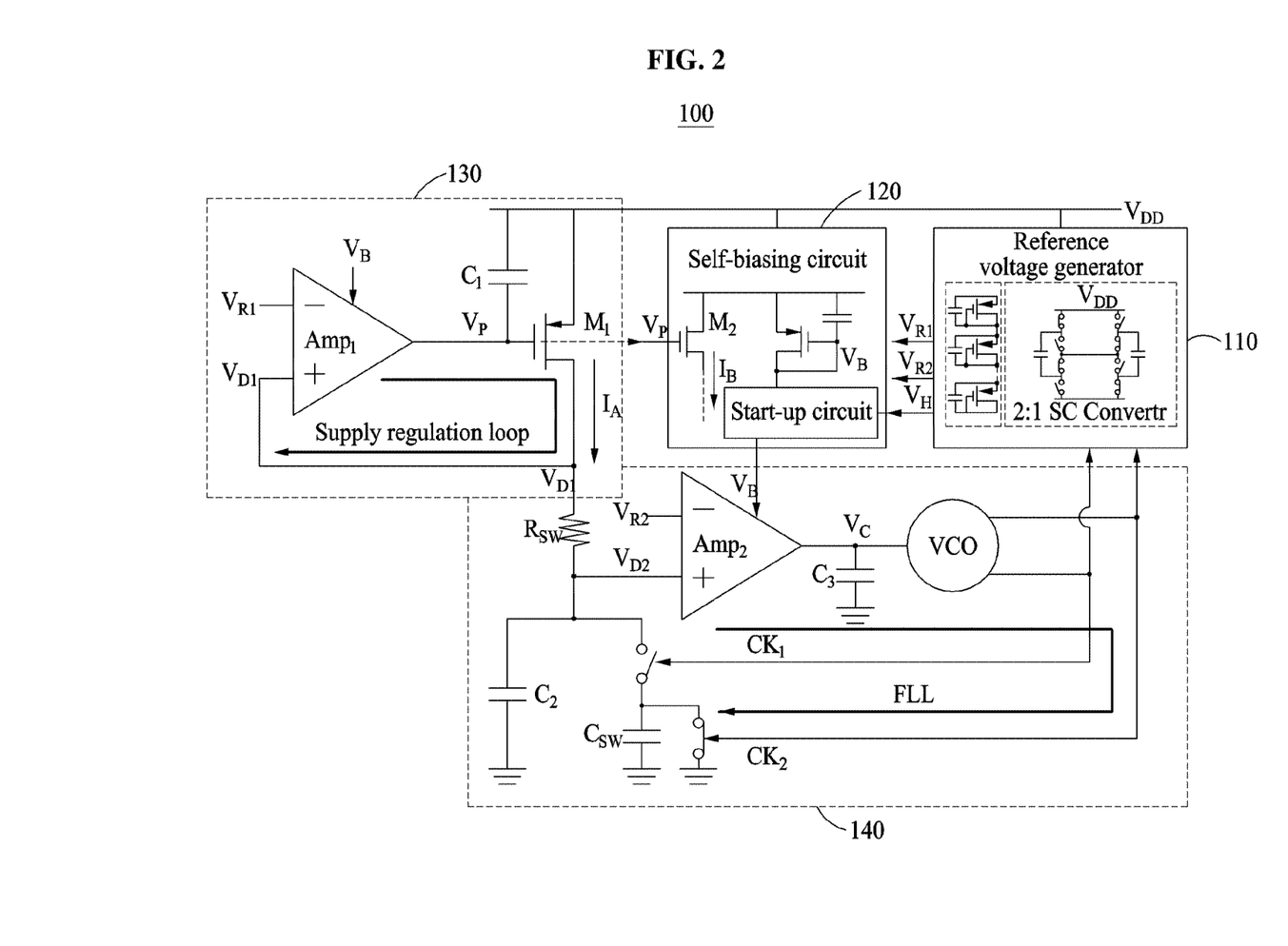
FIG. 2 is a diagram illustrating an example of a circuit configuration of the oscillator of FIG. 1.

FIG. 2 illustrates an example of a circuit configuration of the oscillator 100 of FIG. 1.

Referring to FIG. 2, the oscillator 100 includes a reference voltage generator 110, a self-biasing circuit 120, a supply regulation loop circuit 130 and an FLL circuit 140.

The reference voltage generator 110 generates a plurality of reference voltages, for example, voltages $V_H$, $V_{R1}$, and $V_{R2}$, based on a supply voltage $V_{DD}$.

The self-biasing circuit 120 includes a start-up circuit for an operation of the oscillator 100 in an initial state. The start-up circuit determines a bias voltage $V_B$ in the initial state. To reduce an amount of time used to lock a frequency of a clock signal that is output from the oscillator 100, the start-up circuit increases a bandwidth of a second operational amplifier Amp2 in the initial state in comparison to a steady state of the oscillator 100. In the steady state, an operation of the start-up circuit is terminated.

The supply regulation loop circuit 130 includes a first operational amplifier $Amp_1$ and a transistor $M_1$. In an example, the first operational amplifier $Amp_1$ receives a first reference voltage $V_{R1}$ and a first input voltage $V_{D1}$ using an input terminal, and outputs a voltage $V_P$ using a first output terminal. For example, the first operational amplifier $Amp_1$ receives the first reference voltage $V_{R1}$ using a first input terminal, and receives the first input voltage $V_{D1}$ using a second input terminal. In an example, the first output terminal of the first operational amplifier $Amp_1$ is connected to a gate terminal of the transistor $M_1$.

In an example, the transistor $M_1$ is a P-type transistor. When a voltage applied to the gate terminal decreases, a current $I_A$ flowing in the transistor $M_1$ increases. A source terminal of the transistor $M_1$ is connected to the supply voltage $V_{DD}$, and a drain terminal of the transistor $M_1$ is connected to the second input terminal of the first operational amplifier $Amp_1$. A drain voltage (for example, the first input voltage $V_{D1}$) of the transistor $M_1$ is fed back to the second input terminal of the first operational amplifier $Amp_1$.

For example, the first reference voltage $V_{R1}$ received from the reference voltage generator 110 is assumed to be constant. In this example, when the first input voltage $V_{D1}$ becomes greater than the first reference voltage $V_{R1}$, the voltage $V_P$ output from the first output terminal of the first operational amplifier $Amp_1$ increases. In response to an increase in the voltage $V_P$, the current $I_A$ flowing in the transistor $M_1$ and the drain voltage of the transistor $M_1$ decrease. Thus, it is possible to suppress a phenomenon in which the first input voltage $V_{D1}$ becomes greater than the first reference voltage $V_{R1}$.

When the first input voltage $V_{D1}$ becomes less than the first reference voltage $V_{R1}$, the voltage $V_P$ output from the first output terminal of the first operational amplifier $Amp_1$ decreases. In response to a decrease in the voltage $V_P$, the current $I_A$ flowing in the transistor $M_1$ and the drain voltage of the transistor $M_1$ increase. Thus, it is possible to suppress a phenomenon in which the first input voltage $V_{D1}$ becomes less than the first reference voltage $V_{R1}$.

The supply regulation loop circuit 130 generates the voltage $V_{D1}$ independent of noise of the supply voltage $V_{DD}$ through negative feedback, and the current $I_A$ has a characteristic independent of the noise of the supply voltage $V_{DD}$. When the voltage $V_{D1}$ is stabilized to be constant (i.e., in a steady state) through the negative feedback, the voltage $V_P$ also has a characteristic independent of the noise of the supply voltage $V_{DD}$.

In an example, the FLL circuit 140 includes a second operational amplifier $Amp_2$, a voltage-controlled oscillator (VCO), a switch resistor $R_{SW}$ and a switch capacitor $C_{SW}$.

The second operational amplifier $Amp_2$ receives a second reference voltage $V_{R2}$ and a second input voltage $V_{D2}$ using an input terminal, and outputs a control voltage $V_C$ using a second output terminal. For example, the second operational amplifier $Amp_2$ receives the second reference voltage $V_{R2}$ using a third input terminal and receives the second input voltage $V_{D2}$ using a fourth input terminal. The second output terminal of the second operational amplifier $Amp_2$ is connected to the VCO.

The second input voltage $V_{D2}$ is determined based on a voltage drop occurring in the switch resistor $R_{SW}$ and the drain voltage of the transistor $M_1$. For example, the second input voltage $V_{D2}$ is determined using Equation 1 shown below.

$$I_A = \frac{(V_{D1} - V_{D2})}{R_{SW}} \qquad \text{[Equation 1]}$$

$$V_{D2} = V_{D1} - I_A \times R_{SW}$$

The VCO generates clock signals $CK_1$ and $CK_2$ based on the control voltage $V_C$ output from the second output terminal of the second operational amplifier $Amp_2$. In an example, the clock signals $CK_1$ and $CK_2$ have the same frequency (for example, 32.6 kilohertz (kHz)) and a phase difference of 180 degrees. By turning on or off switches corresponding to the clock signals $CK_1$ and $CK_2$, the switch capacitor $C_{SW}$ is periodically charged and discharged.

In an example, when a switch corresponding to the clock signal $CK_1$ is turned on and when a switch corresponding to the clock signal $CK_2$ is turned off, the switch capacitor $C_{SW}$ is charged. In another example, when the switch corresponding to the clock signal $CK_1$ is turned off and when the switch corresponding to the clock signal $CK_2$ is turned on, the switch capacitor $C_{SW}$ is discharged.

Also, the clock signals $CK_1$ and $CK_2$ are provided to the reference voltage generator 110 and used to generate reference voltages.

The current $I_A$ of FIG. 2 is expressed by Equation 2 below.

$$\begin{aligned} I_A &= \frac{(V_{D1} - V_{D2})}{R_{SW}} \qquad \text{[Equation 2]} \\ &= \frac{(V_{R1} - V_{OS}) - (V_{R2} - V_{OS})}{R_{SW}} \\ &= \frac{(V_{R1} - V_{R2})}{R_{SW}} \end{aligned}$$

In Equation 2, $V_{OS}$ denotes an offset voltage of the first operational amplifier $Amp_1$ and the second operational amplifier $Amp_2$.

Because the offset voltage $V_{OS}$ is eliminated from the current $I_A$ as shown in Equation 2, the current $I_A$ has a characteristic independent of the offset voltage $V_{OS}$. Also, because the first input voltage $V_{D1}$ and the second input voltage $V_{D2}$ are independent of the noise of the supply voltage $V_{DD}$ as described above, the current $I_A$ has a characteristic independent of the noise of the supply voltage $V_{DD}$. Thus, based on the current $I_A$ having a characteristic independent of both the offset voltage $V_{OS}$ and the noise of the supply voltage $V_{DD}$, frequency stability characteristics of the clock signals $CK_1$ and $CK_2$ is effectively enhanced.

A frequency of the clock signal $CK_1$ generated in the oscillator 100 of FIG. 2 is determined using Equation 3 below.

$$C_{SW}(V_{R2} + V_{OS}) = I_A T_{CK1} \quad \text{[Equation 3]}$$

$$V_{OS} < 0.01 V_{R2},$$

$$C_{SW}(V_{R2} + V_{OS}) \approx C_{SW} V_{R2} = I_A T_{CK1} = T_{CK1} \frac{(V_{R1} - V_{R2})}{R_{SW}}$$

$$\text{Frequency of } CK_1 = \frac{1}{T_{CK1}} = \frac{(V_{R1} - V_{R2})}{V_{R2} R_{SW} C_{SW}}$$

The switch resistor $R_{SW}$ and the switch capacitor $C_{SW}$ are connected in series. By the above serial connection, it is possible to reduce a current mismatch in comparison to a parallel connection between the switch resistor $R_{SW}$ and the switch capacitor $C_{SW}$. Also, by the serial connection reduces a power consumption.

A bandwidth of the supply regulation loop circuit 130 is allowed to be wider than a bandwidth of the FLL circuit 140, and thus it is possible to prevent an occurrence of an interference between the supply regulation loop circuit 130 and the FLL circuit 140. In an example, the bandwidth of the supply regulation loop circuit 130 is 20 times greater than the bandwidth of the FLL circuit 140.

For example, a periodic ripple occurring in the first input voltage $V_{D1}$ and the second input voltage $V_{D2}$ may be effectively removed by an output impedance of an operational amplifier and low-pass filters that each include capacitors $C_1$ and $C_3$.

Figure 3:
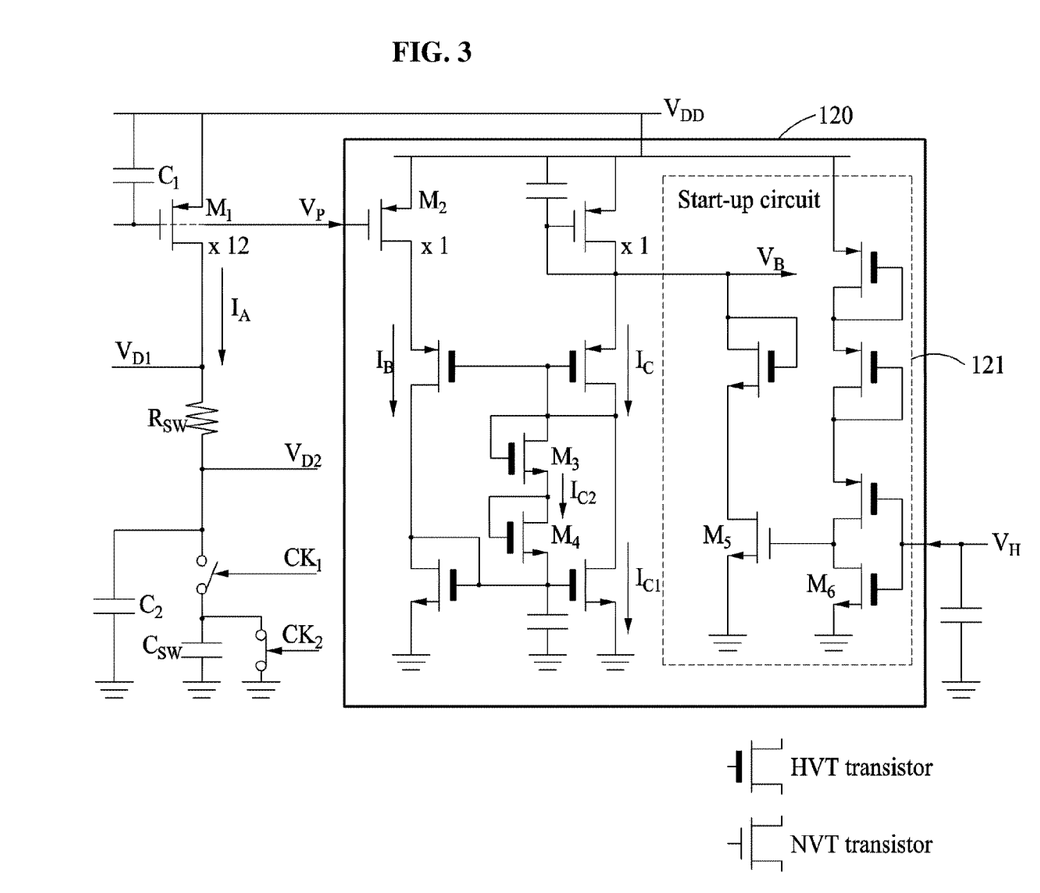
FIG. 3 is a diagram illustrating an example of a self-biasing circuit of FIG. 1.

FIG. 3 illustrates an example of the self-biasing circuit 120 of FIG. 1.

Referring to FIG. 3, the self-biasing circuit 120 includes a start-up circuit 121.

The self-biasing circuit 120 is substituted for a reference current source, and accordingly it is possible to enhance a power efficiency instead of using a separate reference current source. The power variation due to a temperature change may also be minimized. Using the self-biasing circuit 120, an amount of time used to lock a frequency of a clock signal generated by an oscillator may be effectively reduced.

In an example, a bias voltage $V_B$ generated by the self-biasing circuit 120 needs to be equal to a voltage $V_P$ in the steady state output from the first operational amplifier $Amp_1$ of FIG. 2, to stably operate the first operational amplifier $Amp_1$ and the second operational amplifier $Amp_2$ of FIG. 2 to which the bias voltage $V_B$ is to be provided.

However, when the bias voltage $V_B$ is equal to the voltage $V_P$ in an initial state, a considerable amount of time is used to lock frequencies of clock signals $CK_1$ and $CK_2$ due to an extremely narrow bandwidth of the second operational amplifier $Amp_2$. To reduce an amount of time to lock the frequencies of the clock signals $CK_1$ and $CK_2$, the bandwidth of the second operational amplifier $Amp_2$ is widened by setting the bias voltage $V_B$ to be less than a reference voltage in the initial state. The bias voltage $V_B$ is controlled to be less than the reference voltage, and thus a start-up operation is quickly performed. When the start-up operation is terminated, the bias voltage $V_B$ is equalized to the voltage $V_P$.

The start-up circuit 121 assures a stable initial operation of the self-biasing circuit 120. For example, a third reference voltage $V_H$ of 0 V is provided by a reference voltage generator in the initial state. In response to the third reference voltage $V_H$ passing through an inverter, a high voltage is applied to a gate terminal of a transistor $M_5$. While a current flows in the transistor $M_5$, the bias voltage $V_B$ is determined to be less than the reference voltage. Also, a current $I_C$ greater than a current $I_B$ flows, which satisfies "$I_{C1}=I_{C2}=I_C/2$." Thus, a mismatch between the currents $I_C$ and $I_B$ is compensated for by providing a path to allow a current $I_{C2}$ to flow through transistors $M_3$ and $M_4$.

In a start-up mode ($I_B \ll I_C$) corresponding to the initial state, the control voltage $V_C$ of FIG. 2 gradually increases. When the control voltage $V_C$ increases to be greater than a threshold, a VCO starts to operate to generate clock signals $CK_1$ and $CK_2$. When the clock signals $CK_1$ and $CK_2$ are transferred to the reference voltage generator, a switched-capacitor converter in the reference voltage generator functions as a resistor, and the third reference voltage $V_H$ increases up to ½ times the supply voltage $V_{DD}$.

When the third reference voltage $V_H$ increases, a low voltage is applied to the gate terminal of the transistor $M_5$, and an operation of the start-up circuit 121 is terminated. Accordingly, the bias voltage $V_B$ increases. When the bias voltage $V_B$ increases, a magnitude of the current $I_C$ gradually decreases to be equal to the current $I_B$, and the transistors $M_3$ and $M_4$ are turned off so that the current $I_{C2}$ does not flow. In addition, the bias voltage $V_B$ is fixed at the voltage $V_P$.

A relationship between currents of FIG. 3 is expressed by Equation 4 below.

$$I_C = I_{C1} + I_{C2} \quad \text{[Equation 4]}$$

$$I_{C1} = I_{C2} + I_B$$

$$\text{If } I_B \ll I_C : V_H \approx 0, I_A \approx 0, I_{C1} \approx I_{C2} \approx \frac{I_C}{2}$$

$$\text{If } I_B \approx I_C : I_{C2} \approx 0,$$

$$I_C = I_{C1} \approx I_B = \frac{I_A}{12}, M_3, M_4 \text{ turn off}$$

Figure 4:
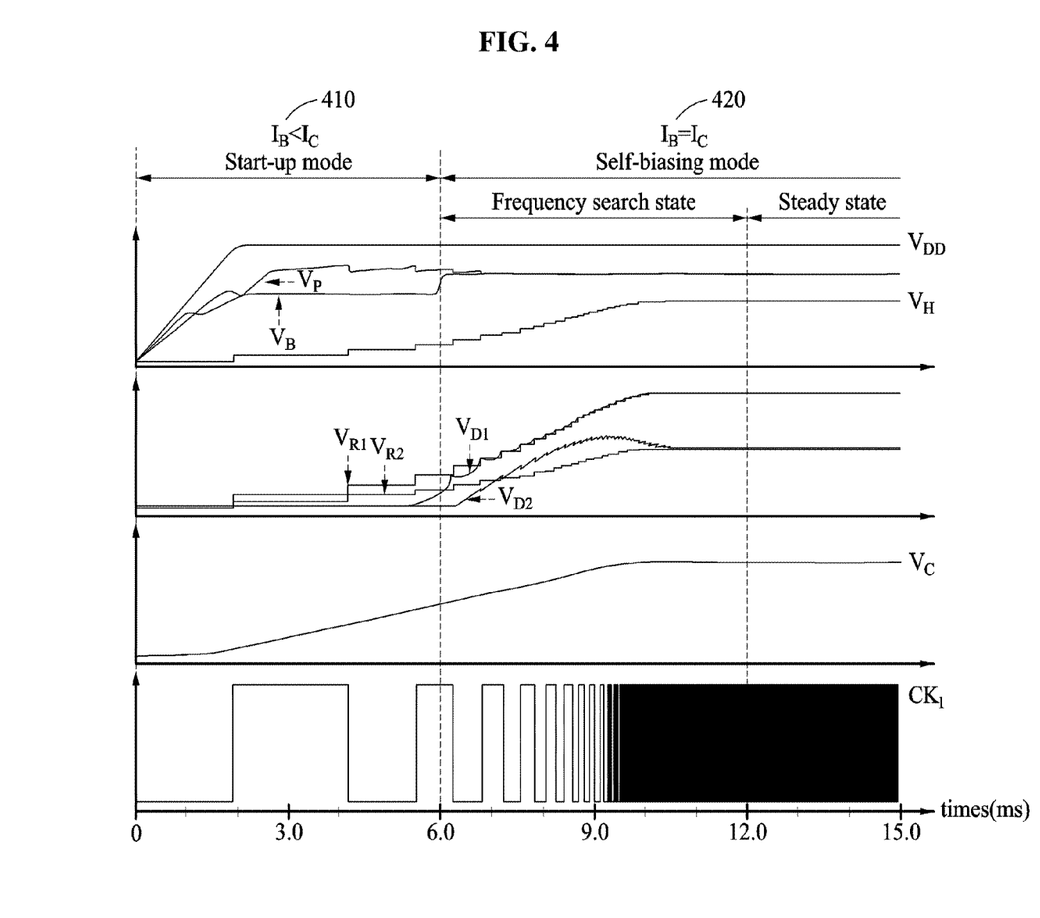
FIG. 4 is a timing diagram illustrating an example of a process of generating a clock signal.

FIG. 4 illustrates an example of a process of generating a clock signal.

FIG. 4 illustrates a clock signal and voltages used in an oscillator.

An operation of the oscillator is classified into a start-up mode 410 and a self-biasing mode 420. The self-biasing mode 420 is classified into a frequency search state and a steady state. The steady state is a state in which a frequency of a clock signal is locked.

As described above, a third reference voltage $V_H$ that is relatively low in an initial state gradually increases to correspond to ½ of the supply voltage $V_{DD}$ in the steady state. A bias voltage $V_B$ that is relatively low in the initial state gradually increases to be equalized to a voltage $V_P$. A control voltage $V_C$ increases up to a threshold, and accordingly a frequency of a clock signal $CK_1$ also increases to be locked at a frequency.

For convenience of description, an operation state of the oscillator is classified into a steady state in which the frequency of the clock signal $CK_1$ is locked, and an initial state in which the frequency is not locked.

Figure 5:
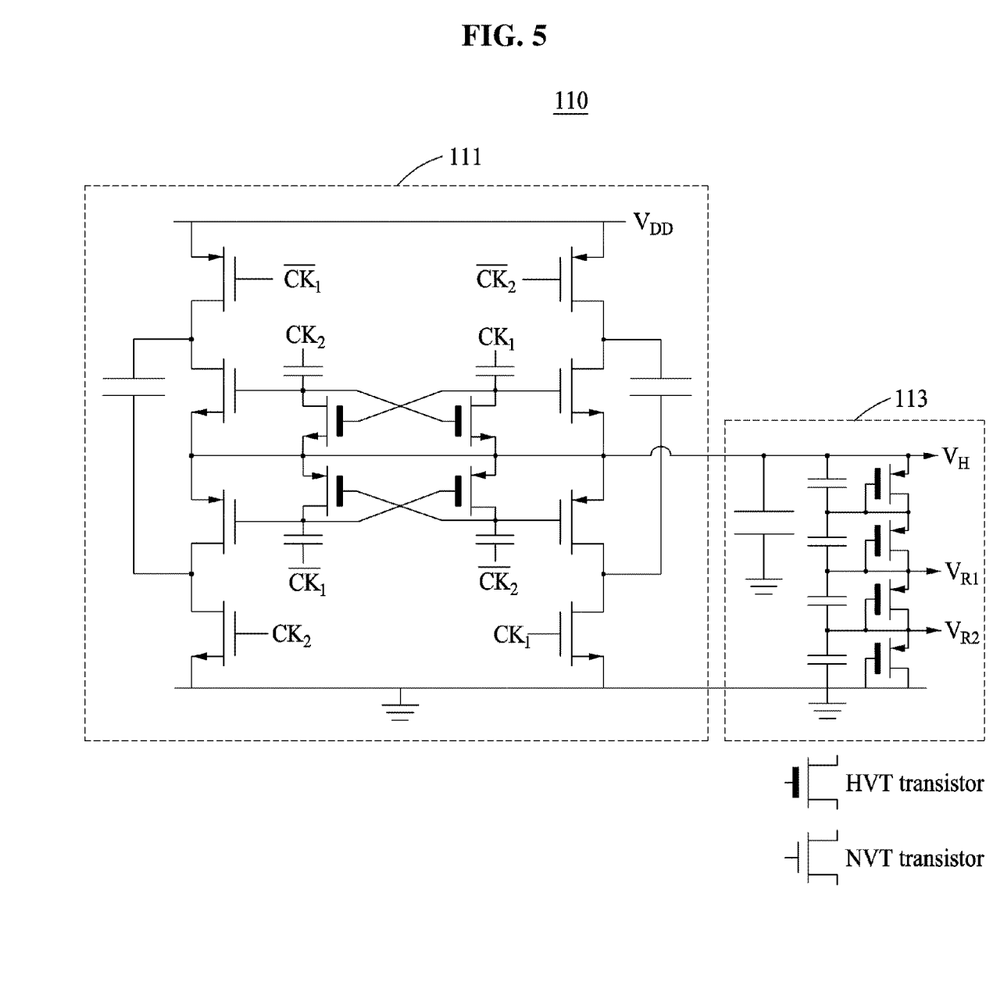
FIG. 5 is a diagram illustrating an example of a reference voltage generator of FIG. 1.

FIG. 5 illustrates an example of the reference voltage generator 110 of FIG. 1.

Referring to FIG. 5, the reference voltage generator 110 includes a 2-to-1 switched-capacitor converter 111, and a PFET stack 113 of p-channel field-effect transistors (PFETs).

To minimize a switching overhead of a VCO, the 2-to-1 switched-capacitor converter 111 is used for a portion of the reference voltage generator 110. A first reference voltage $V_{R1}$ and a second reference voltage $V_{R2}$ are generated as a portion of a third reference voltage $V_H$ in the PFET stack 113. For example, the first reference voltage $V_{R1}$ is twice the second reference voltage $V_{R2}$.

Figure 6:
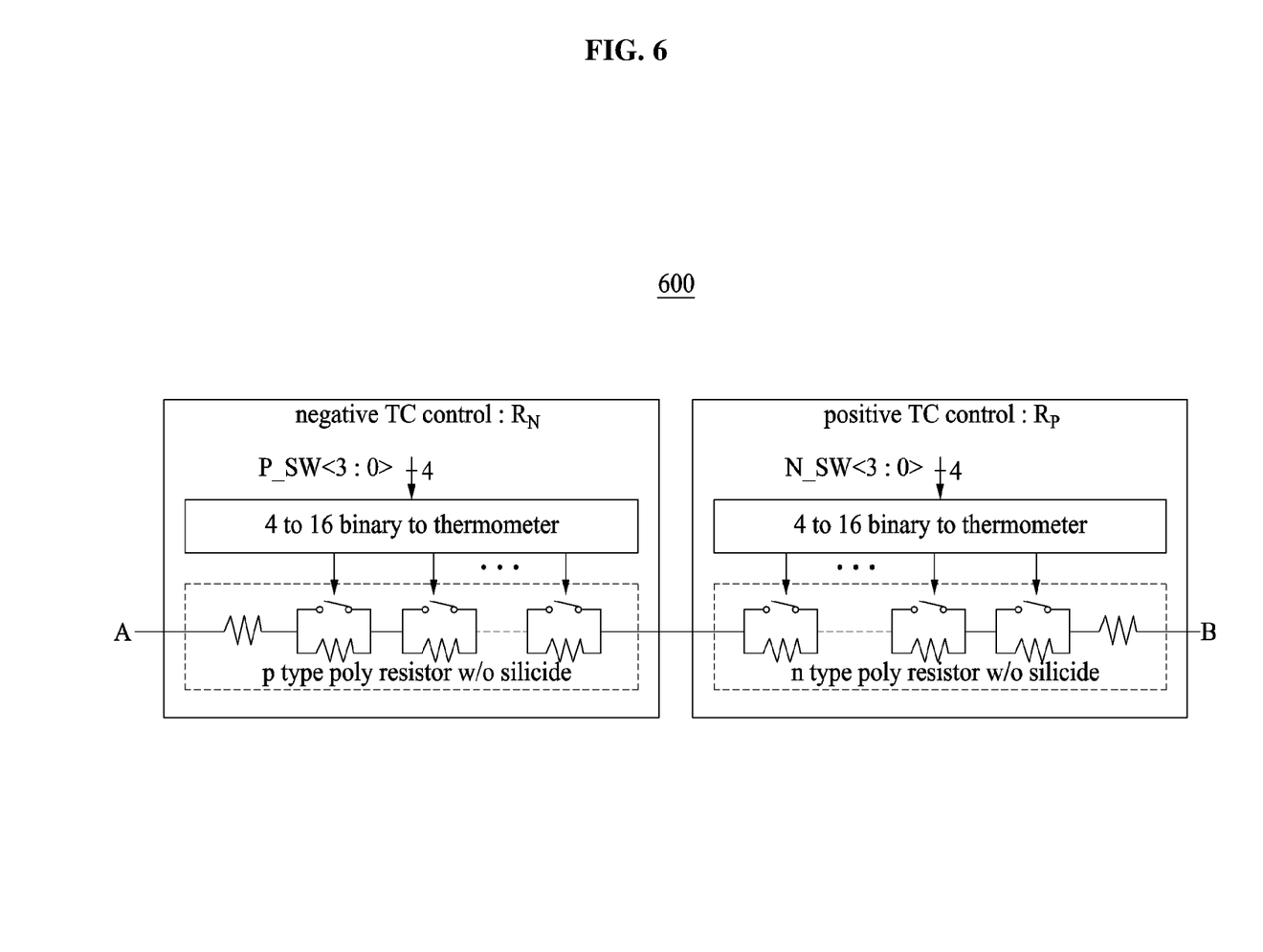
FIG. 6 is a diagram illustrating an example of a switch resistor.

FIG. 6 illustrates an example of a switch resistor 600.

Referring to FIG. 6, the switch resistor 600 is compensated for in response to a temperature change.

The switch resistor 600 includes, in series, a portion in which a resistance value increases as a temperature increases, and a portion in which a resistance value decreases as the temperature increases. Thus, the switch resistor 600 has a constant resistance value despite the temperature change.

Figure 7:
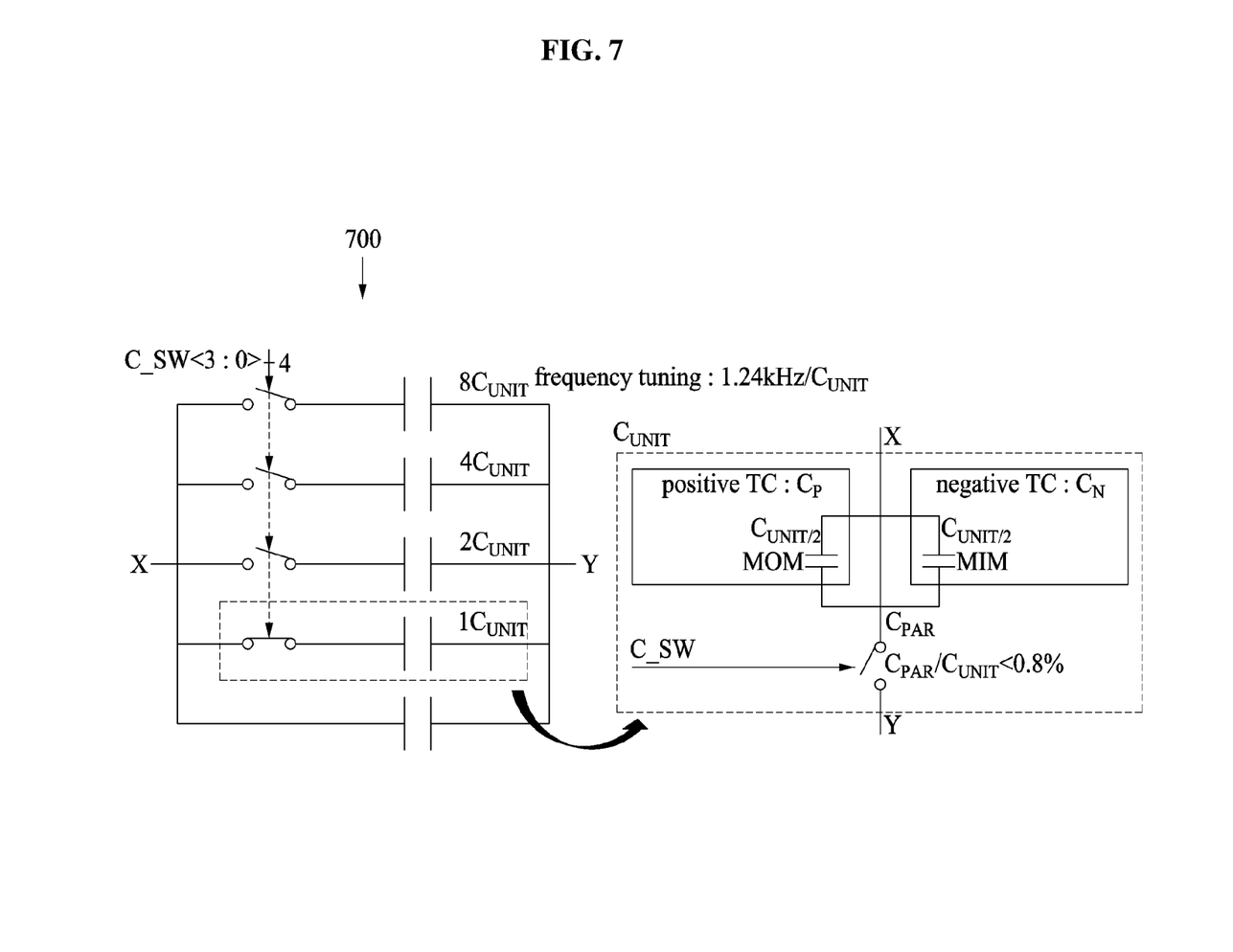
FIG. 7 is a diagram illustrating an example of a switch capacitor.

FIG. 7 illustrates an example of a switch capacitor 700.

Referring to FIG. 7, the switch capacitor 700 is compensated for in response to a temperature change.

The switch capacitor 700 includes, in parallel, a portion in which a capacitance increases as a temperature increases, and a portion in which a capacitance decreases as the temperature increases. Thus, the switch capacitor 700 has a constant capacitance despite the temperature change.

Figure 8:
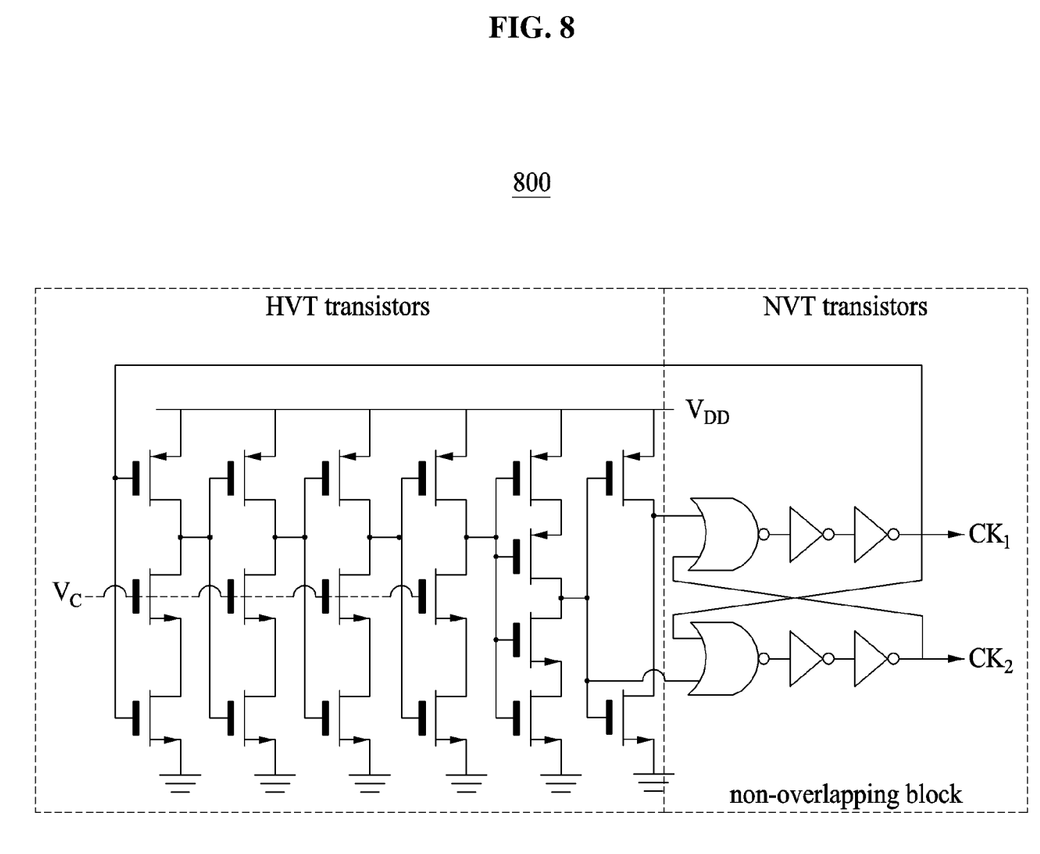
FIG. 8 is a diagram illustrating an example of a voltage-controlled oscillator (VCO).

FIG. 8 illustrates an example of a VCO 800.

Referring to FIG. 8, the VCO 800 includes a non-overlapping block, and generates clock signals $CK_1$ and $CK_2$ based on a control voltage $V_C$.

Figure 9:
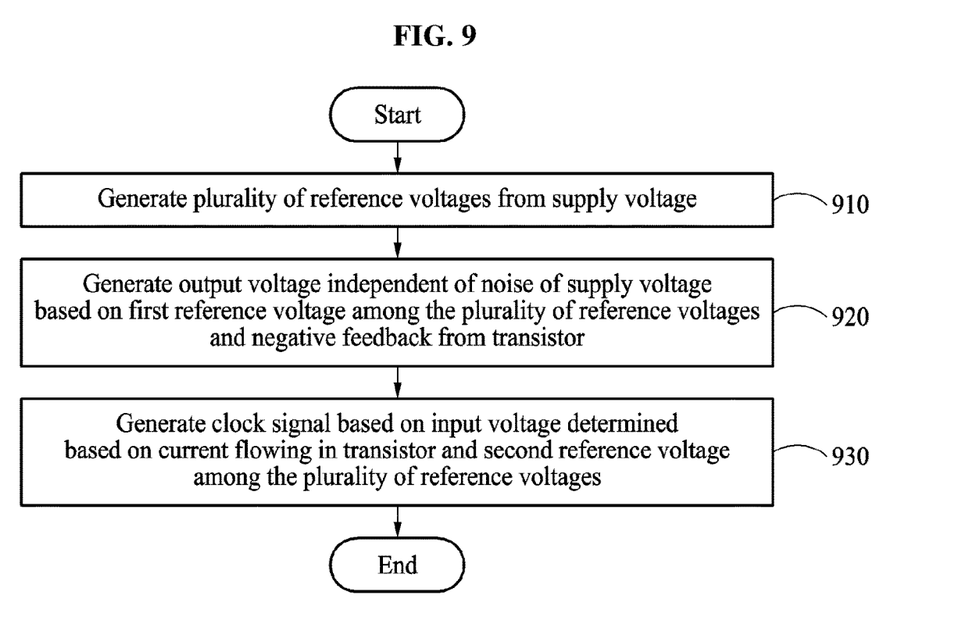
FIG. 9 is a diagram illustrating an example of an operating method of an oscillator.

FIG. 9 is a diagram illustrating an example of a method of an oscillator. The operations in FIG. 9 may be performed in the sequence and manner as shown, although the order of some operations may be changed or some of the operations omitted without departing from the spirit and scope of the illustrative examples described. Many of the operations shown in FIG. 9 may be performed in parallel or concurrently. One or more blocks of FIG. 9, and combinations of the blocks, can be implemented by special purpose hardware-based computer that perform the specified functions, or combinations of special purpose hardware and computer instructions. In addition to the description of FIG. 9 below, the descriptions of FIGS. 1-8 is also applicable to FIG. 9, and are incorporated herein by reference. Thus, the above description may not be repeated here.

Referring to FIG. 9, in operation 910, the oscillator generates a plurality of reference voltages from a supply voltage.

In operation 920, the oscillator generates an output voltage independent of noise of the supply voltage based on a first reference voltage among the plurality of reference voltages, and negative feedback from a transistor.

In operation 930, the oscillator generates a clock signal based on an input voltage determined based on a current flowing in the transistor and a second reference voltage among the plurality of reference voltages.

In an example, the oscillator generates a bias voltage based on the output voltage and a third reference voltage received from a reference voltage generator, and provides the bias voltage to a first operational amplifier and a second operational amplifier included in the oscillator. The oscillator determines the bias voltage to be less than a reference voltage based on a third reference voltage that is input in an initial state of the oscillator. Also, the oscillator terminates an operation of a start-up circuit by a third reference voltage that is input in a steady state of the oscillator, and generates a bias voltage to correspond to an output voltage output from the first operational amplifier.

The apparatuses, units, modules, devices, and other components illustrated in FIGS. 1, 2, 3, and 5 through 8 that perform the operations described in FIG. 9 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. The hardware components also access, manipulate, process, create, and store data in response to execution of the instructions or software. For simplicity, the singular term "processor" or "computer" may be used in the description of the examples described in this application, but in other examples multiple processors or computers may be used, or a processor or computer includes multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIG. 9 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software includes at least one of an applet, a dynamic link library (DLL), middleware, firmware, a device driver, an application program storing the method of preventing the collision. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions.

While this disclosure includes specific examples, it will be apparent after gaining a thorough understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An oscillator comprising:
   a reference voltage generator configured to generate reference voltages from a supply voltage;
   a supply regulation loop circuit comprising a first operational amplifier and a transistor, the first operational amplifier being configured to receive a first reference voltage of the reference voltages, and the transistor being connected to an output terminal of the first operational amplifier; and
   a frequency locked loop (FLL) circuit configured to generate a clock signal, based on an input voltage determined based on a current flowing in the transistor and a second reference voltage of the reference voltages,
   wherein the first operational amplifier comprises:
   an input terminal configured to receive the first reference voltage and to receive negative feedback from the transistor; and
   the output terminal being configured to generate an output voltage independent of noise of the supply voltage.

2. The oscillator of claim 1, wherein
   the output voltage generated by the output terminal of the first operational amplifier is provided to a gate terminal of the transistor,
   the supply voltage is provided to a source terminal of the transistor, and
   a drain voltage of the transistor is fed back to the input terminal of the first operational amplifier.

3. The oscillator of claim 2, wherein a magnitude of the current flowing in the transistor decreases in response to an increase in the output voltage provided to the gate terminal of the transistor.

4. The oscillator of claim 1, wherein the input voltage is determined based on a drain voltage of the transistor and a voltage drop in a switch resistor in which the current flows.

5. The oscillator of claim 1, wherein the FLL circuit comprises:
   a second operational amplifier comprising an input terminal configured to receive the second reference voltage and the input voltage, and an output terminal connected to a voltage-controlled oscillator (VCO); and
   the VCO is configured to generate the clock signal based on a control voltage output from the output terminal of the second operational amplifier.

6. The oscillator of claim 1, wherein the FLL circuit further comprises a switch capacitor configured to be charged or discharged based on the clock signal and is connected in series to a switch resistor in which the current flows.

7. The oscillator of claim 1, further comprising:
   a self-biasing circuit configured to generate a bias voltage based on the output voltage and a third reference voltage of the reference voltages and to provide the bias voltage to the first operational amplifier and a second operational amplifier included in the oscillator.

8. The oscillator of claim 7, wherein the self-biasing circuit comprises a start-up circuit configured to determine the bias voltage to be less than a reference voltage based on the third reference voltage that is input in an initial state of the oscillator.

9. The oscillator of claim 8, wherein the start-up circuit is further configured to determine the bias voltage so that a bandwidth of the second operational amplifier in the initial state is wider than a bandwidth of the second operational amplifier in a steady state of the oscillator.

10. The oscillator of claim 8, wherein
an operation of the start-up circuit is terminated by the third reference voltage that is input in a steady state of the oscillator, and
in the steady state, the bias voltage corresponds to an output voltage output from the first operational amplifier.

11. The oscillator of claim 1, wherein the first reference voltage is determined to be greater than the second reference voltage.

12. The oscillator of claim 1, wherein a switch resistor in which the current flows and a switch capacitor connected in series to the switch resistor are compensated for in response to a temperature change.

13. The oscillator of claim 1, wherein a bandwidth of the supply regulation loop circuit is determined to be greater than a bandwidth of the FLL circuit.

14. The oscillator of claim 7, wherein the reference voltage generator comprises a 2-to-1 switched-capacitor converter and p-channel field-effect transistors (PFETs) stack, and the first reference voltage and the second reference voltage are generated as a portion of a third reference voltage in the PFETs stack.

15. A method of operating an oscillator, comprising:
generating reference voltages from a supply voltage;
generating an output voltage independent of noise of the supply voltage based on a first reference voltage among the reference voltages, and negative feedback from a transistor; and
generating a clock signal based on an input voltage determined based on a current flowing in the transistor and a second reference voltage among the reference voltages.

16. The method of claim 15, further comprising:
generating a bias voltage based on the output voltage and a third reference voltage among the reference voltages and providing the bias voltage to a first operational amplifier and a second operational amplifier included in the oscillator.

17. The method of claim 16, wherein the generating of the bias voltage comprises determining the bias voltage to be less than a reference voltage based on the third reference voltage that is input in an initial state of the oscillator.

18. The method of claim 16, wherein the generating of the bias voltage comprises terminating an operation of a start-up circuit by the third reference voltage that is input in a steady state of the oscillator, and generating the bias voltage to correspond to an output voltage output from the first operational amplifier.

19. A non-transitory computer-readable medium storing instructions that, when executed by a processor, cause the processor to perform the method of claim 15.

* * * * *